(12) United States Patent
Chung et al.

(10) Patent No.: US 6,787,415 B1
(45) Date of Patent: Sep. 7, 2004

(54) NONVOLATILE MEMORY WITH PEDESTALS

(75) Inventors: Mei-Hua Chung, San Jose, CA (US); Ching-Hwa Chen, Milpitas, CA (US); Vei-Han Chan, San Jose, CA (US)

(73) Assignee: Mosel Vitelic, Inc., Hsin-Chu (TW)

( * ) Notice: Subject to any disclaimer, the term of this patent is extended or adjusted under 35 U.S.C. 154(b) by 0 days.

(21) Appl. No.: 10/402,698

(22) Filed: Mar. 28, 2003

(51) Int. Cl.[7] ............................................. H01L 21/336
(52) U.S. Cl. ..................................... 438/257; 257/319
(58) Field of Search ................................. 438/257–258, 438/266–268, 587–588, 201; 257/315–320

(56) References Cited

U.S. PATENT DOCUMENTS

| | | | |
|---|---|---|---|
| 6,355,524 B1 | | 3/2002 | Tuan et al. |
| 6,403,417 B1 | * | 6/2002 | Chien et al. ................. 438/241 |
| 6,451,708 B1 | * | 9/2002 | Ha .............................. 438/738 |

OTHER PUBLICATIONS

Naruke, K.; Yamada, S.; Obi, E.; Taguchi, S.; and Wada, M. "A New Flash–Erase EEPROM Cell with A Sidewall Select-Gate On Its Source Side," 1989 IEEE, pp. 604–606.

Wu, A.T.; Chan T.Y.; Ko, P.K.; and Hu, C. "A Novel High–Speed, 5–Volt Programming EPROM Structure With Source–Side Injection," 1986 IEEE, 584–587.

Mizutani, Yoshihisa; and Makita, Koji "A New EPROM Cell With A Sidewall Floating Gate Fro High–Density and High Performance Device," 1985 IEEE, 635–638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split–Gate Source–Side–Injection Cell for 5V–Only Applications," 1994 Symposium on VLSI Technology Digest of Technical Papers, pp. 49–50.

Mih, Rebecca et al. "0.18um Modular Triple Self–Aligned Embedded Split–Gate Flash Memory," 2000 Symposium on VLSI Technology Digest of Technical Papers, pp. 120–121.

* cited by examiner

*Primary Examiner*—David Nelms
*Assistant Examiner*—David Vu
(74) *Attorney, Agent, or Firm*—Michael Shenker; MacPherson Kwok Chen & Heid LLP (57) ABSTRACT

Nonvolatile memory wordlines (160) are formed as sidewall spacers on sidewalls of row structures (280). Each row structure may contain floating and control gates (120, 140), or some other elements. Pedestals (340) are formed adjacent to the row structures before the conductive layer (160) for the wordlines is deposited. The pedestals are formed in the area of the contact openings (330.1) that will be etched in an overlying dielectric (310) to form contacts to the wordlines. The pedestals raise the top surface of the wordline layer near the contact openings, so the contact opening etch can be made shorter. The pedestals also increase the minimum thickness of the wordline layer near the contact openings, so the loss of the wordline layer during the etch of the contact openings becomes less critical, and the photolithographic tolerances required for patterning the contact openings can be relaxed. The pedestals can be dummy structures (they may have no electrical functionality).

43 Claims, 8 Drawing Sheets

NONVOLATILE MEMORY WITH PEDESTALS

BACKGROUND OF THE INVENTION

The present invention relates to integrated circuits, and more particularly to nonvolatile memories.

In a typical integrated circuit, a number of conductive or semiconductor layers are separated by dielectric layers. The conductive and semiconductor layers contact each other through openings in the dielectric layers. It is desirable to facilitate the formation of these contact openings in the dielectric layers.

SUMMARY

This section summarizes some features of the invention. Other features are described in subsequent sections. The invention is defined by the appended claims.

Formation of contact openings is particularly difficult if an underlying feature is narrow or sloped. See for example K. Naruke et al., "A New Flash-Erase EEPROM Cell with a Sidewall Select-Gate on Its Source Side", IEDM Technical Digest 1989, pages 603–606, hereby incorporated by reference. The Naruke article describes a flash memory with a select gate formed as a sidewall spacer. The spacer is formed over a sidewall of a structure containing the floating and control gates. The spacer is formed by depositing and anisotropically etching a polysilicon layer. The spacer can be quite narrow. Also, it is well known that sidewall spacers formed by an anisotropic etch without a mask may have a sloping surface, their height gradually decreasing to zero. When a contact opening is formed to a narrow spacer, the photolithographic alignment must be precise. Also, the contact resistance can be high. Further, due to the sloping surface, the etch of the contact opening must be highly selective to the spacer material because the loss of the spacer material may further reduce the spacer width (making the spacer even more narrow).

In some embodiments of the present invention, formation of contacts to spacers is facilitated by use of pedestals in the area of the contact openings. A pedestal is an upward projecting feature, possibly a dummy feature having no electrical functionality. For example, in the case of the memory described in the Naruke article cited above, a pedestal can be provided near the sidewall of the structure containing the floating and control gates. The pedestal is formed before the spacer layer (the polysilicon layer) is deposited. When the spacer layer is deposited, the spacer layer fills the area between the pedestal and the structure with the floating and control gates. The minimum thickness of the select gate is therefore increased near the pedestal. The increased thickness counteracts the loss of the select gate material during the etch of the contact opening. Consequently, the etch process margin is increased (the etch does not have to be as selective, or as carefully timed, to avoid the loss of the select gate material), the photolithographic alignment tolerance can be relaxed when the opening is being patterned, and the contact resistance tends to be lower. In addition, the top surface of the select gate becomes less sloped. Further, the top surface becomes higher, so the contact opening does not have to be as deep.

In some embodiments, the pedestal has sub-lithographic dimensions because it does not have to be printed reliably when it is photolithographically patterned. The pedestal may be formed from the same layer or layers as other features of the integrated circuit.

The invention is not limited to spacers, select gates, polysilicon, and other particulars. The invention is defined by the appended claims.

DETAILED DESCRIPTION OF SOME EMBODIMENTS

The embodiments described in this section illustrate but do not limit the invention. The invention is not limited to any specific circuit diagrams, layouts, materials, or dimensions. The invention is defined by the appended claims.

Figure 1:
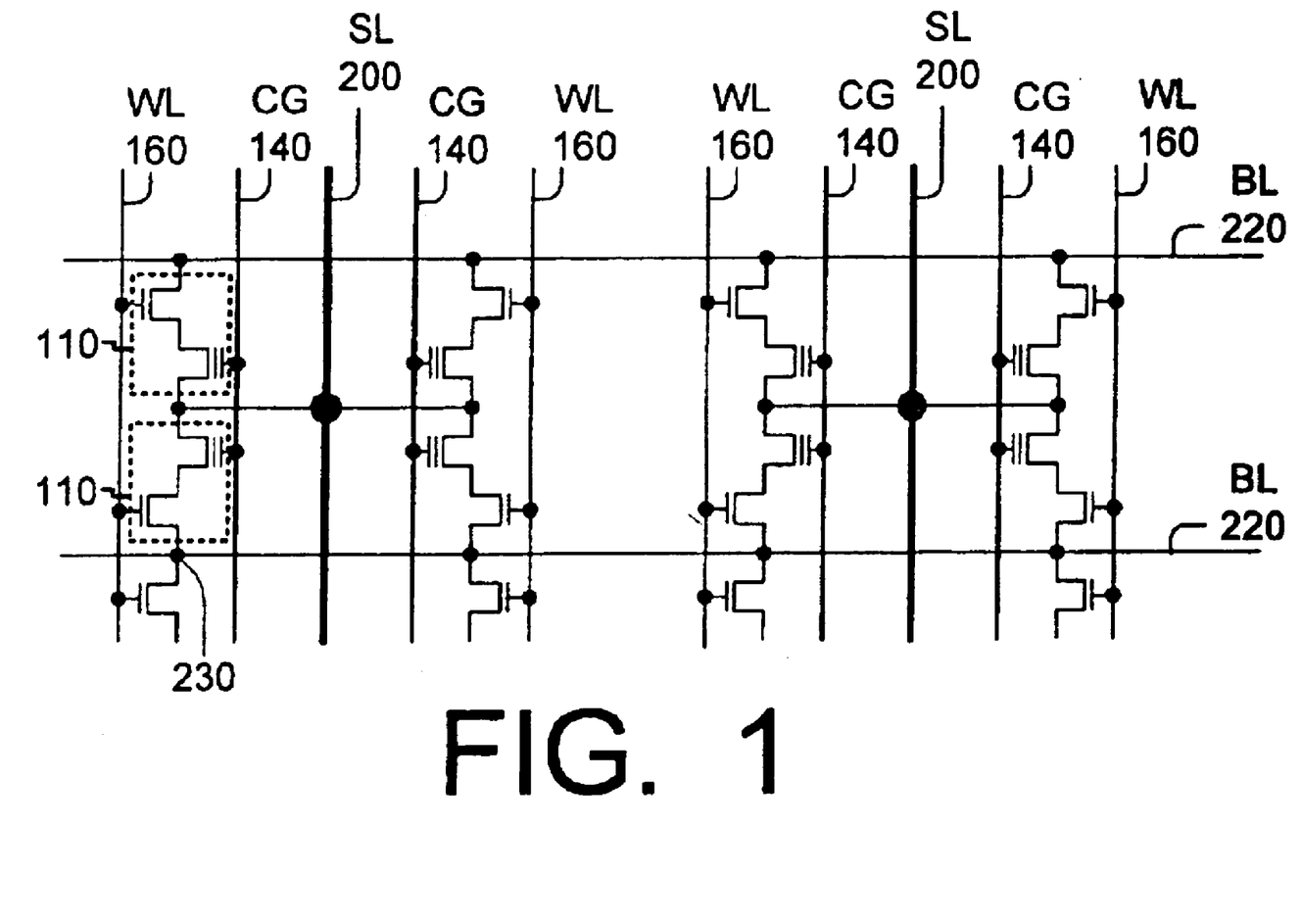
FIG. 1 is a circuit diagram of a nonvolatile memory according to one embodiment of the present invention.
Figure 2:
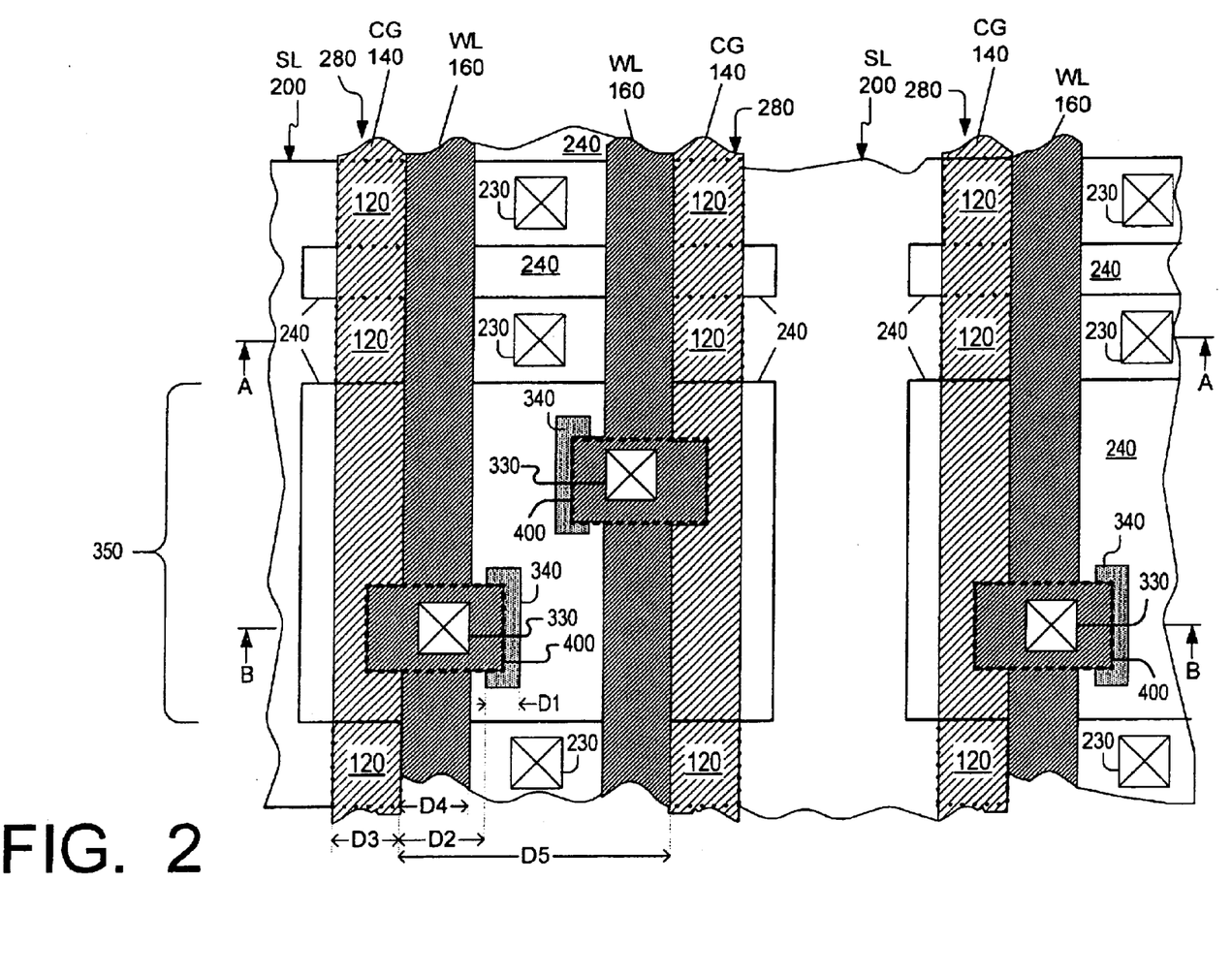
FIG. 2 is a top view of the memory of FIG. 1 according to some embodiments of the present invention.
Figure 3A:
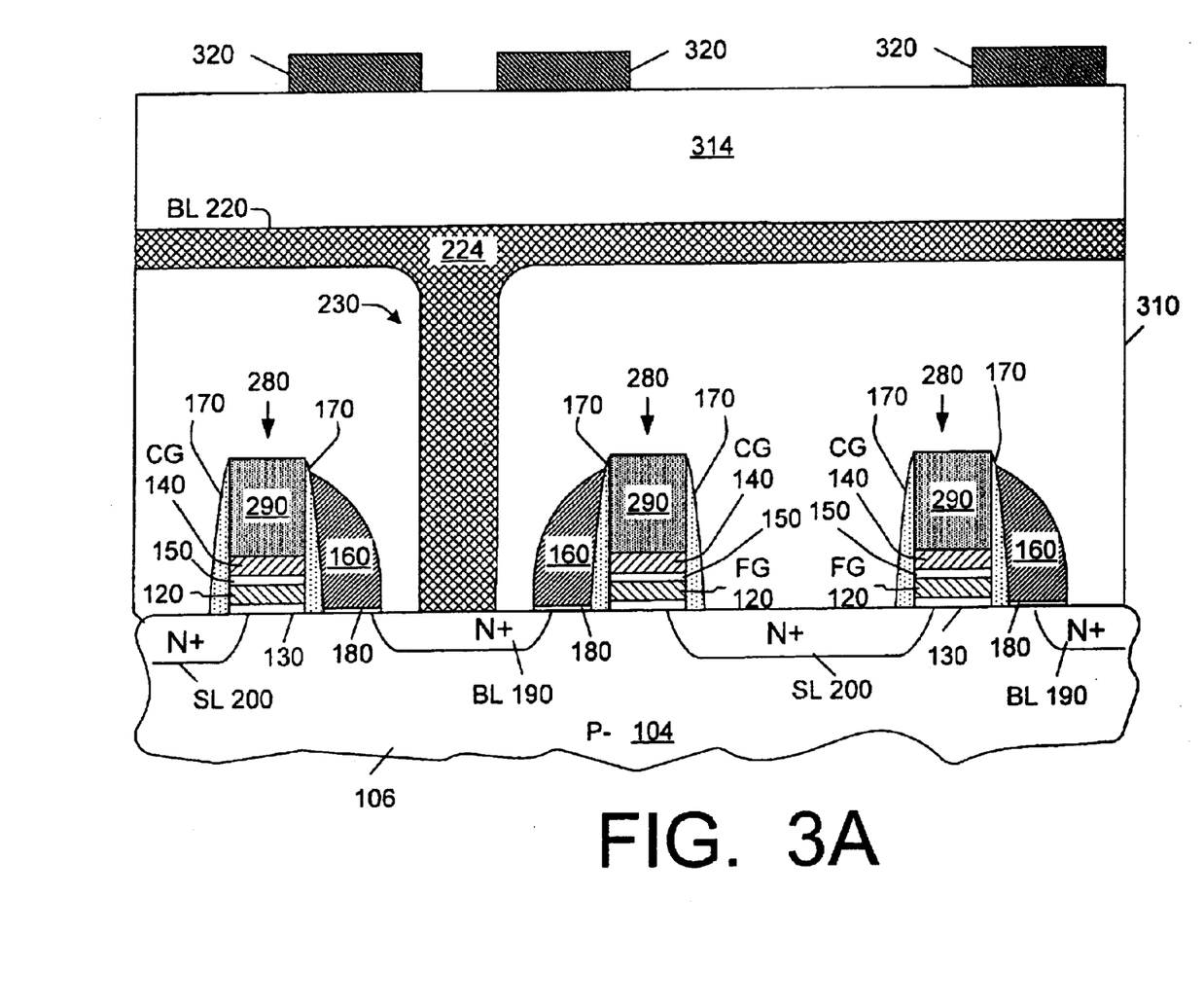
FIGS. 3A, 3B are cross sectional views of the memory of FIG. 2 according to some embodiments of the present invention.
Figure 3B:
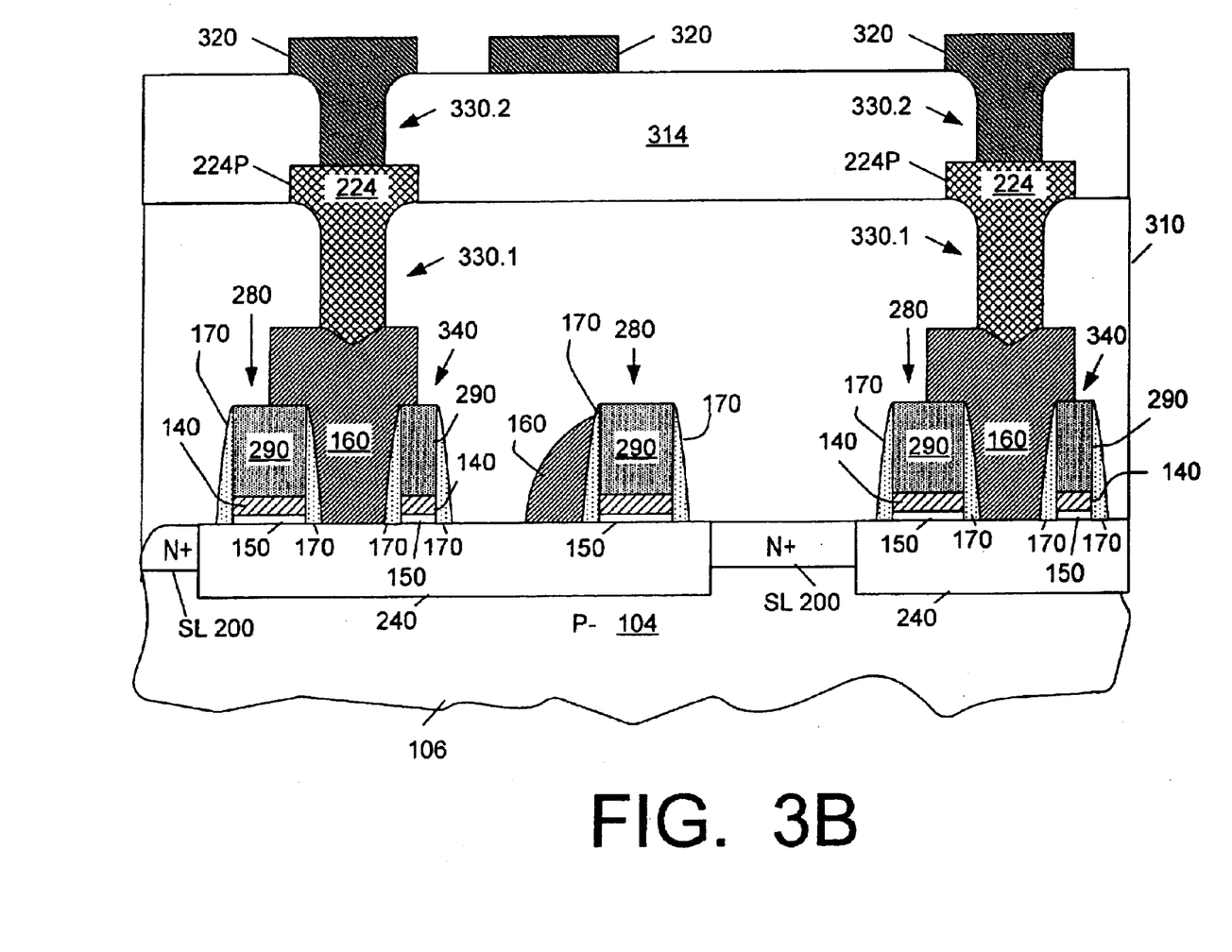

FIG. 1 is a circuit diagram of a flash memory array that will be used to illustrate one embodiment of the present invention. FIG. 2 is a top view of the memory of FIG. 1. FIG. 3A shows a cross section along the line A—A in FIG. 2. FIG. 3B shows a cross section along the line B—B in FIG. 2.

The memory is fabricated in and over a P type well 104 (doped P−), shown in FIGS. 3A and 3B. Well 104 is formed in a semiconductor substrate 106 (e.g. monocrystalline silicon) and isolated from the rest of the substrate by an N type region (not shown). Each memory cell 110 includes a conductive floating gate 120 insulated from P well 104 by dielectric 130. Control gate 140 overlies the floating gate. Control gate 140 is part of a conductive control gate line (e.g. polysilicon) that provides control gates for one row of the memory cells. The control gates are insulated from the underlying floating gates by dielectric 150. In each row, a conductive wordline 160 provides the select gates for the memory cells. The wordline 160 is insulated from control gates 140 and floating gates 120 by dielectric 170, and from P well 104 by dielectric 180.

Each memory cell 110 has two N+ source/drain regions 190, 200 in P well 104. Region 200 ("source line" region), adjacent to floating gate 120, is part of an N+ source line. The source lines run in the row direction. Each source line 200 is shared by two adjacent rows.

In each column of the memory cells, "bitline regions" 190 are connected to a bitline 220 (FIG. 3A). The bitline is formed from an overlying conductive layer 224. The contact openings to bitline regions 190 are shown at 230 in FIGS. 2 and 3A.

Isolation trenches 240 (FIGS. 2, 3B) are formed in substrate 106 between adjacent columns of the memory cells. Each trench 240 extends across two memory rows between two respective source lines 200. The trenches are filled with dielectric. We will use the same numeral 240 for the trenches and the dielectric filling the trenches. In FIG. 3B, the dielectric totally fills the trenches and is limited to the trenches. In other embodiments, the dielectric projects above the trenches. Depending on the embodiment, the dielectric may or may not totally fill the trenches.

In FIG. 1, each cell 110 is represented as a floating gate transistor and a select gate transistor connected in series. This diagram is not a precise representation of the memory because the channel regions of the floating gate transistor and the select transistor are merged together. (The channel region of the floating gate transistor is a P type region in well 104 under the floating gate 120. The channel region of the select transistor is a P type region in well 104 under select gate 160.) There is no N type region between the two channel regions. Other embodiments include an N type region between the two channel regions. Of note, some embodiments are non-flash EEPROM memories.

Each wordline 160 is formed as a spacer on a sidewall of a row structure 280 which includes dielectric 130, floating gates 120, dielectric 150, and control gate line 140 for the corresponding row of the memory cells. Row structure 280 also includes a silicon nitride layer 290 formed on top of control gate line 140 to control the size of the wordline spacer 160. Nitride 290 is not shown in FIG. 2. Row structure 280 includes dielectric spacers 170 separating the control gate line 140 and the floating gates 120 from wordline 160. Each row structure 280 projects upward over the top surface of substrate 106 and trench dielectric 240. Dielectric spacers 170 form a dielectric sidewall of each row structure 280. The wordline 160 overlies one such sidewall in each row.

Dielectric 310 (FIGS. 3A, 3B) overlies the row structures 280 and the wordlines 160. Conductive layer 224 from which the bitlines are formed overlies the dielectric 310. Dielectric 314 overlies the conductive layer 224. A layer 320 overlies dielectric 314. Contact openings 330.1 in dielectric 310 and contact openings 330.2 in dielectric 314 allow an electrical path to be formed between wordlines 160 and layer 320. Conductive plugs 224P are formed in openings 330.1. These plugs contact the wordlines 160. Layer 320 contacts the plugs 224P through openings 330.2. In one embodiment, layer 320 is a conductive layer patterned to form strap lines to reduce the resistance between different wordline portions. Each strap line 320 runs over the corresponding wordline 160 and electrically contacts the wordline through openings 330.1, 330.2 at periodic intervals along the memory row. See U.S. patent application Ser. No. 09/972,388 filed Oct. 5, 2001, incorporated herein by reference. In some embodiments, the layer 320 has a lower resistivity, a lower sheet resistance, and a lower resistance per unit length than the wordline layer 160. The invention is not limited to the use of strap lines. Also, in some embodiments, the strap lines are formed on dielectric 310; plugs 224P are omitted; bitlines 220 overlie the layer 320.

Making contacts to wordlines 160 is facilitated by pedestals 340 (FIGS. 2, 3B) formed adjacent to row structures 280 near contact openings 330.1. The pedestals project upward over the top surface of substrate 106 and trench dielectric 240. Wordlines 160 overlie the pedestals. At each pedestal 340, the wordline stretches between the dielectric sidewall of structure 280 and the pedestal and reaches the pedestal. The pedestals change the profile of the top surface of wordlines 160 near openings 330.1. The top surface of the wordlines is raised up, so the openings 330.1 do not have to be as deep. Also, the minimum thickness of wordlines 160 is increased near the openings. The increased thickness counteracts the loss of layer 160 during the etch of openings 330.1. Consequently, the etch process margin is increased, the photolithographic alignment tolerances are relaxed when the openings are patterned, and the wordline contact resistance tends to be lower.

The width D1 (FIG. 2) of each pedestal 340 can be smaller than the minimum linewidth (a minimum width that can be reliably printed with a photolithographic equipment used to fabricate the memory) because the pedestals do not need to be printed reliably. In one embodiment, the minimum linewidth is 0.18 μm, and the width D1 is 0.1 μm. The pedestal length is large enough to accommodate the opening 330.1 (the pedestal length is 0.22 μm in one example). In one such embodiment, the distance D2 between the pedestal 340 and the adjacent control gate line 140 is 0.2 μm. The width D3 of control gate 140 is 0.18 μm. The width D4 of wordline spacer 160 in areas spaced from the openings 330.1 is also 0.18 μm. The distance D5 between adjacent control gate lines 140 (between the sidewalls overlaid by the wordlines) is 0.8 μm. The pedestal height is 251 nm. These dimensions are exemplary and not limiting.

In the embodiment being described, pedestals 340 are formed from the layers 150, 140, 290, 170 used also to form the structures 280. In other embodiments, pedestals 340 include layers not present in structures 280.

In the embodiment of FIGS. 2, 3A, 3B, pedestals 340 are dummy structures, i.e. they do not have any electrical functionality. In particular, the portions of conductive layer 140 in pedestals 340 are dummy elements (having no electrical functionality) rather than circuit elements.

In this embodiment, the wordlines are widened near the openings 330.1. In other embodiments, the wordlines are not widened near the contact openings. The invention covers embodiments in which the wordlines' width remains unchanged near the contact openings, and embodiments in which the wordlines are narrower near the contact openings.

In the embodiment of FIGS. 2, 3A, 3B, contact openings 330.1, 330.2 are located in gaps 350 created in the memory array (see for example, U.S. Pat. No. 6,355,524 incorporated herein by reference). Only one such gap is shown in FIG. 2. There are no memory cells (no floating gates) in gaps 350. Control gate lines 140 and source lines 200 run uninterrupted through gaps 350. Placing the contact openings 330.1, 330.2 into the gaps is done to avoid a short between the wordline contacts and the bitline contacts in openings 230. Trenches 240 are formed in substrate 106 in gaps 350. The trenches are optional. The gaps are also optional.

Figure 4A:
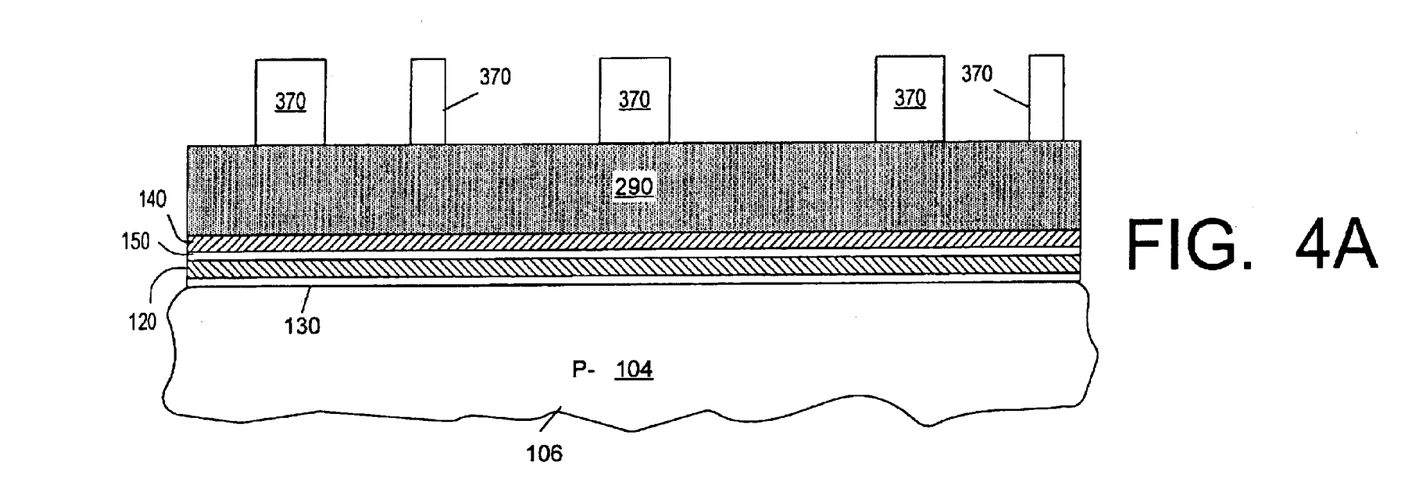
FIGS. 4A, 4B, 5–7 are cross sectional views of the memory of FIGS. 2, 3A, 3B in the process of fabrication.
Figure 4B:
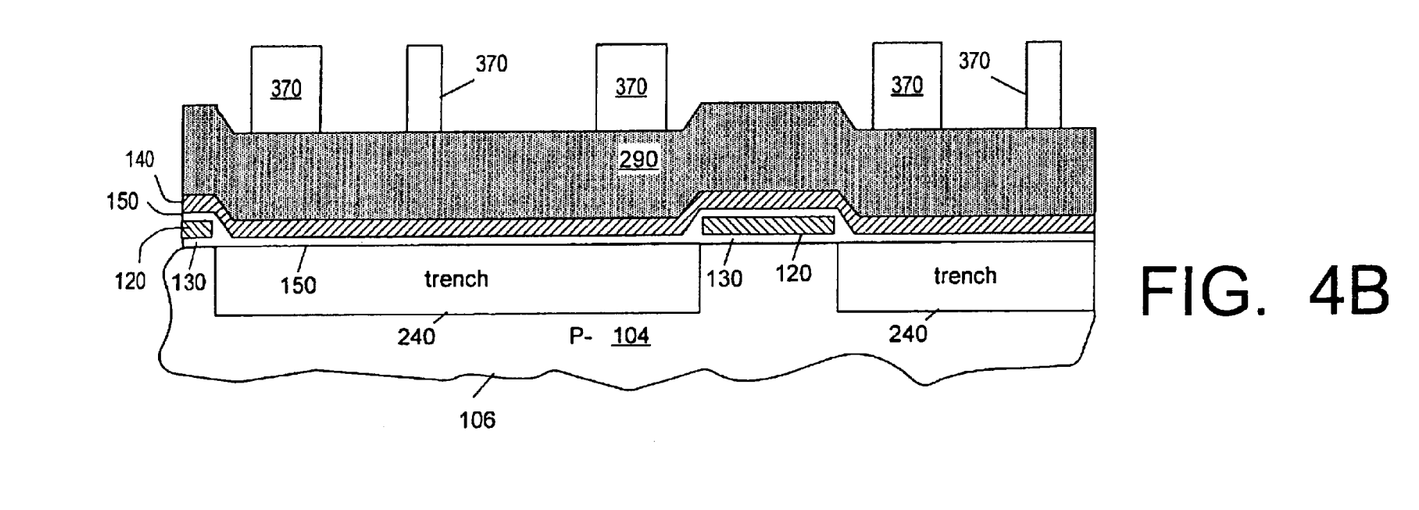

The memory can be fabricated by a process described in the aforementioned U.S. Pat. No. 6,355,524. Briefly, P well 104 is isolated by N type dopant implantation. Dielectric 130 ("tunnel oxide") is formed on substrate 106. In one embodiment, dielectric 130 is a 9 nm thick layer of silicon dioxide. (The dimensions and materials are given for illustration and are not limiting.) A doped polysilicon layer 120 is deposited on oxide 130. The thickness of layer 120 is 120 nm. Then a silicon nitride mask (not shown) is formed on layer 120 to define isolation trenches 240. Polysilicon 120, oxide 130, and substrate 106 are etched where exposed by this mask, so that the isolation trenches 240 are formed. Trenches 240 are filled with a suitable dielectric (e.g. silicon dioxide). See FIGS. 4A, 4B. FIG. 4A shows a cross section along the line A—A in FIG. 2. FIG. 4B shows a cross section along the line B—B.

Then dielectric 150 is deposited. In one embodiment, dielectric 150 is ONO, i.e. a sandwich of silicon dioxide, silicon nitride, and silicon dioxide. Exemplary thicknesses of the oxide, nitride, oxide layers are 6 nm, 4 nm, and 1 nm respectively. Doped polysilicon 140 is deposited on dielectric 150, to a thickness of 80 nm for example. Silicon nitride 290 is deposited on polysilicon 140. An exemplary thickness of nitride 290 is 160 nm. (Given these exemplary dimensions, the height of each pedestal 340 will be 6+4+1+80+160=251 nm above the trench dielectric 240.)

A photoresist layer 370 is deposited and patterned to define the control gate lines 140 and the pedestals 340. Silicon nitride 290 is removed where exposed by resist 370. The photoresist can then be removed, with the silicon nitride 290 acting as a hard mask. Polysilicon 140 and dielectric 150 are etched away where exposed by nitride 290. Then the exposed portion of polysilicon 120 and some of the underlying dielectric 130 are etched away. See FIG. 5 (FIG. 5 and the subsequent figures show the cross sections along the line B—B in FIG. 2.) Before the etch of polysilicon 120, another photoresist mask (not shown) can be formed over peripheral areas of the memory to protect the substrate 106.

The exposed sidewalls of polysilicon layers 120, 140 are oxidized, and then thin silicon nitride spacers are formed on the sidewalls of structures 280, to produce dielectric 170. Dielectric 170 also forms on the sidewalls of pedestals 340. The exposed portions of oxide 130 are etched away.

Gate dielectric 180 (silicon dioxide) is grown on substrate 106 for the select transistors. Polysilicon 160 is deposited over the structure (by low pressure chemical vapor deposition LPCVD, for example), and is heavily doped during or after the deposition. Polysilicon 160 fills the areas between the pedestals 340 and the adjacent row structures 280. In some embodiments, polysilicon 160 is about 300 nm thick. Pedestals 340 lift up the polysilicon 160 in the pedestal areas. Pedestals 340 make the profile of polysilicon 160 more horizontal (less sloped) in the areas between the pedestals and the structures 280, and the minimum polysilicon thickness is increased in these areas.

A photoresist mask 400 (FIG. 5) is formed to protect the layer 160 near pedestals 340. The boundary of mask 400 is shown in FIG. 2 by a dotted line. This mask covers the areas of to-be-formed contact openings 330.1. Polysilicon 160 is subjected to an anisotropic, preferentially vertical etch (e.g. reactive ion etching, RIE). The horizontal etch rate may or may not be zero, but it is less than the vertical etch rate. The etch forms spacers on the sidewalls of structures 280 and pedestals 340 in the areas not protected by the resist 400. See FIG. 6.

Figure 7:
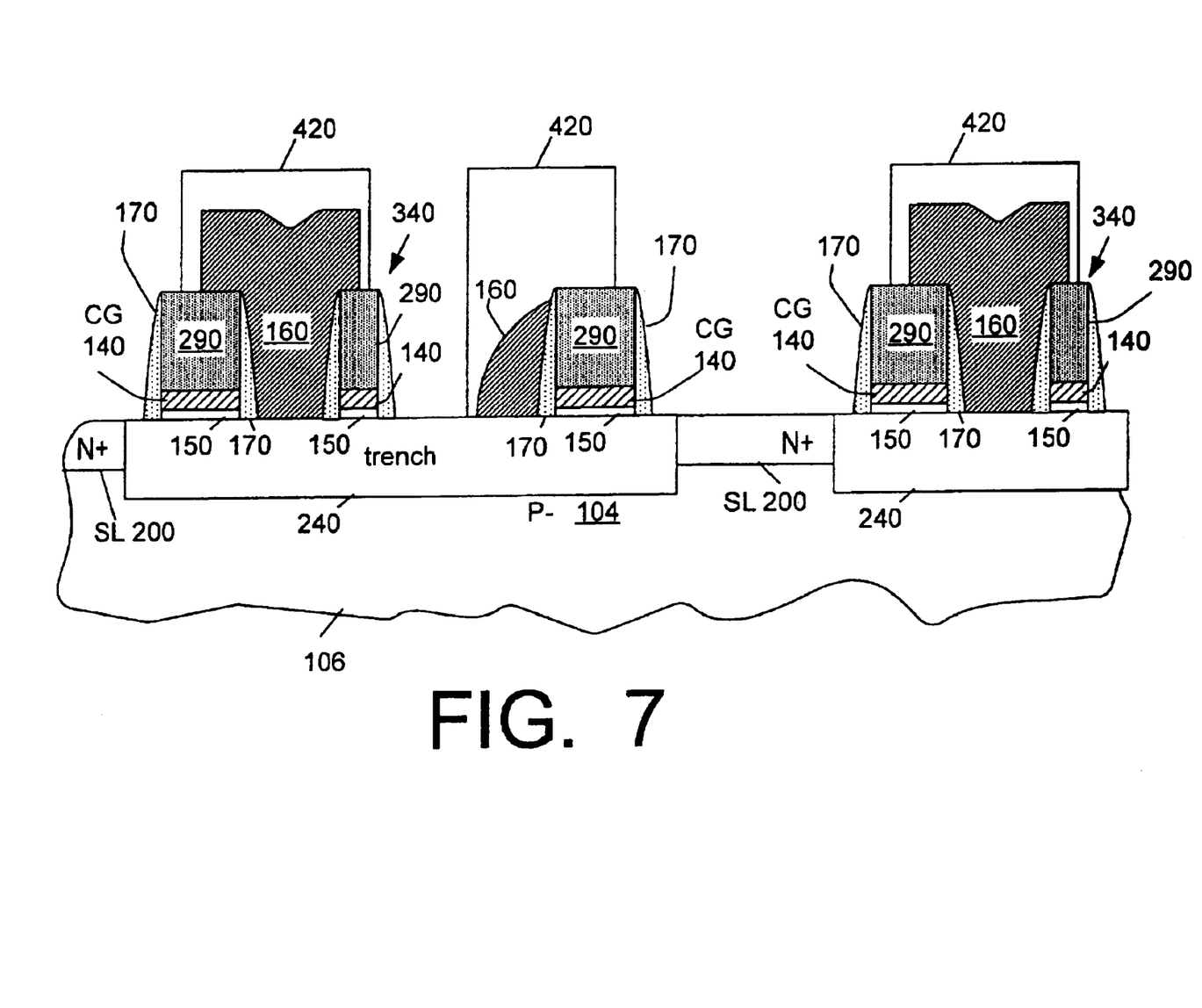

Unwanted polysilicon spacers 160 are etched off the source line side of each row structure 280, using photoresist mask 420 (FIG. 7). Mask 420 protects the polysilicon wordlines 160. Optionally, some of polysilicon 160 on the sidewalls of pedestals 340 is also etched away.

Then dopant implantation steps are performed to create source line regions 200 and bitline regions 190 (FIG. 3A).

Other steps are performed as needed to form peripheral circuitry. The peripheral transistor gates can be formed from layers 120, 140, and/or 160. After the etch of polysilicon 160 shown in FIG. 7, dielectric (not shown) can be deposited and etched to form spacers on the sidewalls of the peripheral transistor gates to provide LDD (lightly doped drain) structures. The invention is not limited to any peripheral processing.

Interlayer dielectric (e.g. phosphosilicate glass, PSG) 310 is deposited over the wafer, and polished back using chemical mechanical polishing (CMP). See FIGS. 3A, 3B. Contact openings 230, 330.1 are etched in dielectric 310. Conductive layer 224 (e.g. tungsten) is deposited and patterned to form bitlines 220 and plugs 224P.

Dielectric 314 is formed over the structure. Contact openings 330.2 (FIG. 3B) are etched in dielectric 314. Metal 320 is deposited and patterned to provide strap lines for wordlines 160.

With the exemplary dimensions given herein, the height of each pedestal 340 is 251 nm as noted above. (The height of pedestals 340 is the combined thickness of layers 150, 140, and 290). The height of each row structure 280 over the trench dielectric 240 is also 251 nm. The initial thickness of polysilicon layer 160 is 300 nm as noted above, but after the anisotropic etch the polysilicon spacers 160 are at most as high as the structures 280 in some embodiments. Therefore, in the area of trenches 240, the spacers 160 are at most 251 nm in height. In the area of pedestals 240, the height of wordlines 160 is 300 nm or greater. The etch of openings 330.1 is therefore shortened.

Figure 5:
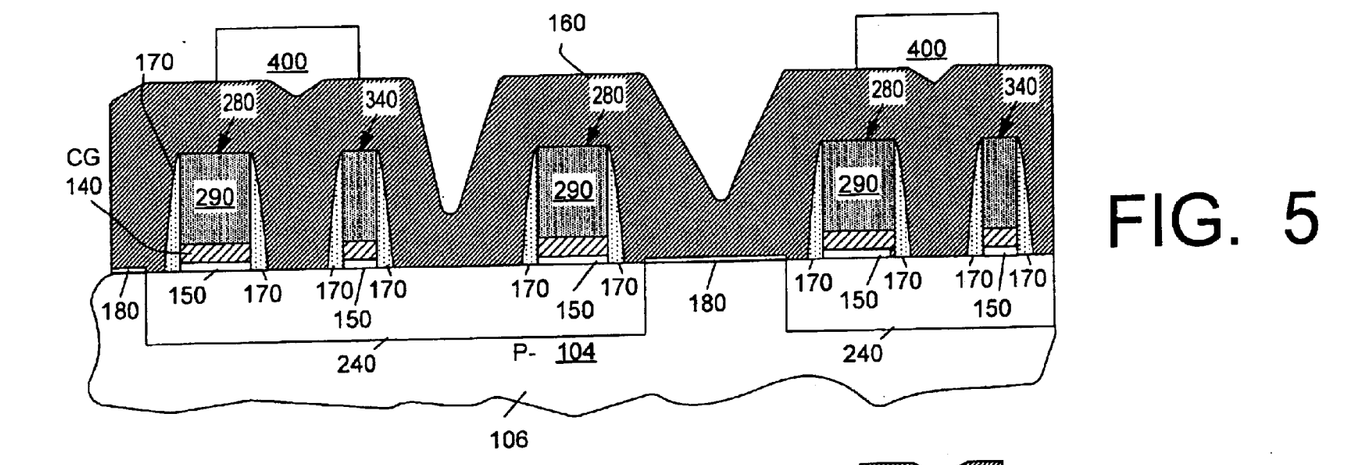
Figure 6:
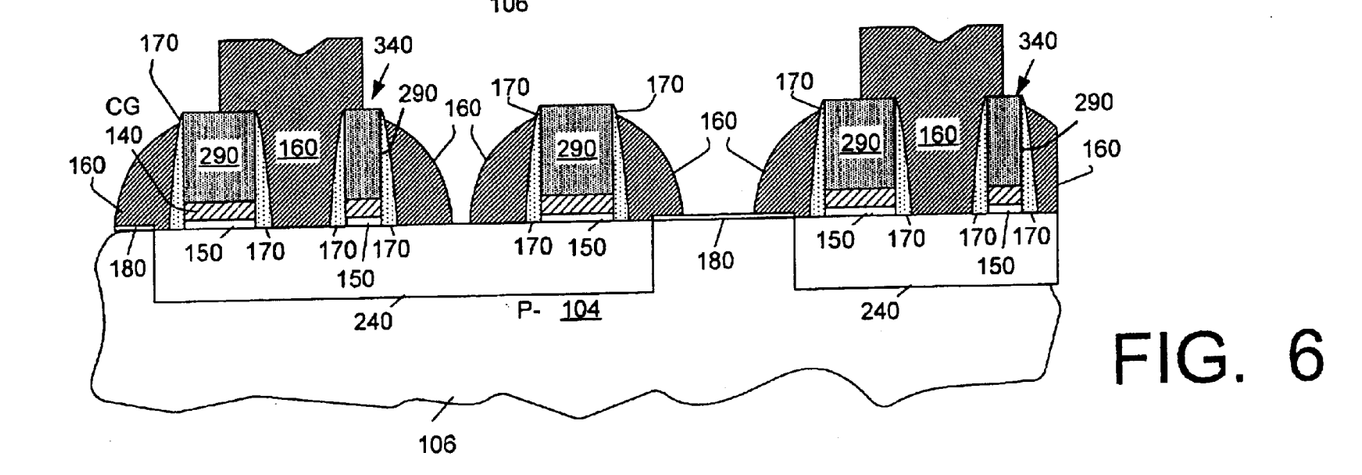
Figure 8:
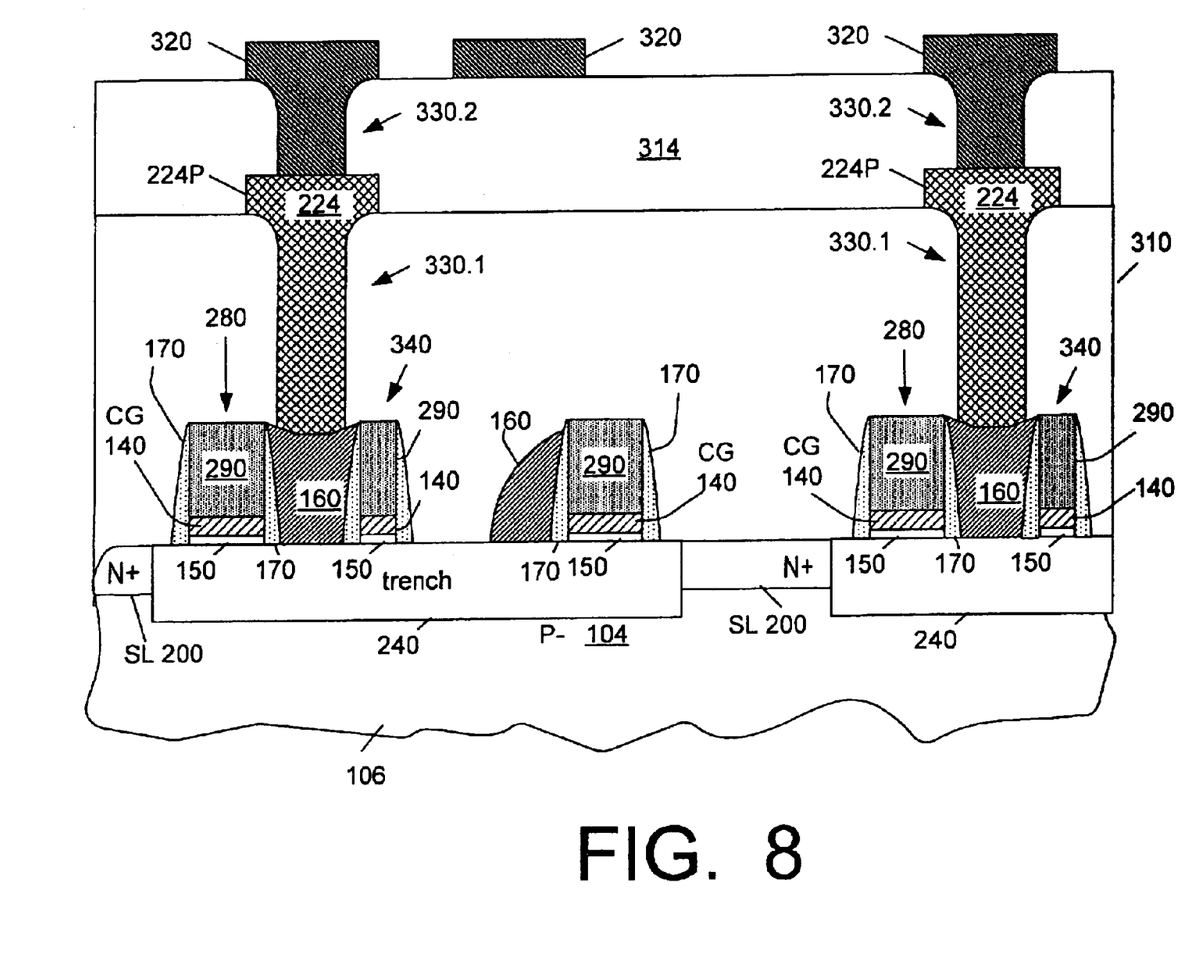
FIG. 8 is a cross sectional view of the memory of FIG. 2 according to some embodiments of the present invention.

In another embodiment, mask 400 of FIG. 5 is omitted. The array cross section is shown in FIG. 8. Due to the proximity of pedestals 340 to row structures 280, the polysilicon 160 is not etched out between the pedestals and the adjacent structures 280 by the anisotropic spacer-forming etch. Consequently, the minimum thickness of polysilicon layer 160 is increased in the area between the pedestals 340 and the structures 280, and the top surface of layer 160 is more planar in these areas after the etch. Also, if the distance between the pedestals 340 and the adjacent structures 280 is greater than the width of a spacer 160, the layer 160 is widened near the pedestals. In some embodiments however, the width of layer 160 remains unchanged or decreases near the pedestals.

The invention is not limited to the embodiments described above. For example, in FIGS. 3A, 3B, the top surface of wordlines 160 is higher near the pedestals 340 than in the regions away from the pedestals. This is not necessary, however. The top surface of wordlines 160 near the pedestals can be of the same height as the top surface of wordlines 160 away from the pedestals. The top surface of wordlines 160 near the pedestals can also be lower than the top surface of wordlines 160 away from the pedestals. The invention is not limited to the particular materials or process parameters, layer thicknesses, or other details. The invention is applicable to other memory circuits and memory cell structures. For example, isolation trenches 240 are optional. Other isolation techniques can be used (e.g. LOCOS). Further, the memory may have no control gates. See R. Mih et al., "0.18 um Modular Triple Self-Aligned Embedded Split-Gate Flash Memory", 2000 Symposium on VLSI Technology, Digest of Technical Papers, pages 120–121 incorporated herein by reference. The memory may be programmed or erased through P well 104 or wordlines 160 or by other mechanisms, known or to be invented. Other embodiments and variations are within the scope of the invention, as defined by the appended claims.

What is claimed is:

1. A method for manufacturing an integrated circuit, the method comprising:

(a) forming over a semiconductor substrate:

one or more first structures projecting upward, each first structure comprising floating gates for a plurality of nonvolatile memory cells associated with the first structure, each first structure comprising a dielectric sidewall;

one or more pedestals projecting upward, each pedestal being adjacent to the dielectric sidewall of at least one first structure;

(b) forming a layer of material and etching said layer of material to provide one or more conductive lines, each conductive line overlaying the dielectric sidewall of at least one first structure and providing conductive gates to the memory cells associated with the first structure, wherein the conductive line has a first portion that stretches between the dielectric sidewall and an adjacent pedestal and reaches the pedestal, and the conductive line has a second portion that is not located between the sidewall and a pedestal, the second portion being a sidewall spacer not protected by a mask during the etching operation.

2. The method of claim 1 wherein the entire conductive line, including the first portion, is not protected by a mask during the etching operation.

3. The method of claim 2 wherein the etching operation is performed without masking the first structures and the pedestals.

4. The method of claim 1 wherein the first portion of the conductive line is protected by a mask during the etching operation.

5. The method of claim 1 wherein a minimum thickness of each first portion is greater than a minimum thickness of each second portion.

6. The method of claim 1 wherein a minimum thickness of each first portion is about equal to a minimum thickness of each second portion.

7. The method of claim 1 wherein a minimum thickness of each first portion is less than a minimum thickness of each second portion.

8. The method of claim 1 wherein a top surface of each first portion reaches higher than a top surface of the second portion adjacent to the first portion.

9. The method of claim 1 wherein a top surface of each first portion reaches as high as a top surface of the second portion adjacent to the first portion.

10. The method of claim 1 wherein a top surface of each portion does not reach as high as a top surface of the second portion adjacent to the first portion.

11. The method of claim 1 wherein the conductive lines are wider at the first portions than at the second portions.

12. The method of claim 1 wherein the conductive lines are narrower at the first portions than at the second portions.

13. The method of claim 1 wherein the conductive lines are as wide at the first portions as at the second portions.

14. The method of claim 1 wherein a width of the sidewall spacer is less than the distance between the dielectric sidewall and the adjacent pedestal.

15. The method of claim 1 wherein a width of the sidewall spacer is greater than the distance between the dielectric sidewall and the adjacent pedestal.

16. The method of claim 1 wherein a width of the sidewall spacer is equal to the distance between the dielectric sidewall and the adjacent pedestal.

17. The method of claim 1 wherein forming the first structures and the pedestals comprises forming and patterning at least one layer of material so that said layer of material provides at least a portion of each first structure and at least a portion of each pedestal.

18. The method of claim 1 wherein each pedestal is formed entirely of a layer or layers present in the first structures.

19. The method of claim 1 wherein each pedestal comprises at least one conductive feature which is a dummy element and not a circuit element of the integrated circuit.

20. The method of claim 1 wherein the pedestals have no electrical functionality.

21. The method of claim 1 further comprising depositing a dielectric layer over the conductive lines and forming one or more openings in the dielectric layer to expose the first portions of the conductive lines.

22. The method of claim 21 further comprising depositing conductive material in the openings to make electrical contact to the conductive lines.

23. The method of claim 1 wherein each conductive line is a wordline extending along a row of the memory cells.

24. An integrated circuit comprising:

a semiconductor substrate;

one or more first structures over the semiconductor substrate, the first structures projecting upward, each first structure comprising floating gates for a plurality of nonvolatile memory cells associated with the first structure, each first structure comprising a dielectric sidewall;

one or more pedestals projecting upward over the semiconductor substrate, each pedestal being adjacent to the dielectric sidewall of at least one first structure;

one or more conductive lines, each conductive line overlaying the dielectric sidewall of at least one first structure and providing conductive gates to the memory cells associated with the first structure, wherein the conductive line has a first portion that stretches between the dielectric sidewall and an adjacent pedestal and reaches the pedestal, and the conductive line has a second portion that is not located between the sidewall and a pedestal.

25. The integrated circuit of claim 24 wherein a minimum thickness of each first portion is greater than a minimum thickness of each second portion.

26. The integrated circuit of claim 24 wherein a minimum thickness of each first portion is about equal to a minimum thickness of each second portion.

27. The integrated circuit of claim 24 wherein a minimum thickness of each first portion is less than a minimum thickness of each second portion.

28. The integrated circuit of claim 24 wherein a top surface of the first portion reaches higher than a top surface of the second portion adjacent to the first portion.

29. The integrated circuit of claim 24 wherein a top surface of the first portion reaches as high as a top surface of the second portion adjacent to the first portion.

30. The integrated circuit of claim 24 wherein a top surface of the first portion does not reach as high as a top surface of the second portion adjacent to the first portion.

31. The integrated circuit of claim 24 wherein the conductive lines are wider at the first portions than at the second portions.

32. The integrated circuit of claim 24 wherein the conductive lines are narrower at the first portions than at the second portions.

33. The integrated circuit of claim 24 wherein the conductive lines are as wide at the first portions as at the second portions.

34. The integrated circuit of claim 24 wherein a width of the second portion is less than the distance between the dielectric sidewall and the adjacent pedestal.

35. The integrated circuit of claim 24 wherein a width of the second portion is greater than the distance between the dielectric sidewall and the adjacent pedestal.

36. The integrated circuit of claim 24 wherein a width of the second portion is equal to the distance between the dielectric sidewall and the adjacent pedestal.

37. The integrated circuit of claim 24 wherein each pedestal comprises at least one conductive feature which is a dummy element and not a circuit element of the integrated circuit.

38. The integrated circuit of claim 24 wherein at least one pedestal has no electrical functionality.

39. The integrated circuit of claim 24 wherein each conductive line is a wordline extending along a row of the memory cells.

40. The integrated circuit of claim 24 wherein at least one first portion stretching from the dielectric sidewall to the pedestal extends over the pedestal.

41. The integrated circuit of claim 24 further comprising a dielectric layer overlying the conductive lines and having one or more openings, wherein the first portions of the conductive lines are located at the bottom of the openings.

42. The integrated circuit of claim 41 further comprising a conductive layer overlying the dielectric layer and contacting the conductive lines through the openings.

43. The integrated circuit of claim 24 wherein the outer surface of each pedestal is formed from a different material than the dielectric overlying the first structure.

* * * * *